(12) United States Patent
RaghuRam

(10) Patent No.: US 7,359,257 B2
(45) Date of Patent: Apr. 15, 2008

(54) SEMICONDUCTOR MEMORY MODULE AND ELECTRONIC APPARATUS INCLUDING A SEMICONDUCTOR MEMORY MODULE AND METHOD FOR OPERATING THEREOF

(75) Inventor: Siva RaghuRam, Germering (DE)

(73) Assignee: Infineon Technologies AG, Munich (DE)

( * ) Notice: Subject to any disclaimer, the term of this patent is extended or adjusted under 35 U.S.C. 154(b) by 215 days.

(21) Appl. No.: 11/364,135

(22) Filed: Feb. 28, 2006

(65) Prior Publication Data

US 2007/0201256 A1 Aug. 30, 2007

(51) Int. Cl.
*G11C 7/00* (2006.01)
(52) U.S. Cl. .................. 365/191; 365/51; 365/194; 365/198
(58) Field of Classification Search ................ 365/191, 365/51, 194, 198
See application file for complete search history.

(56) References Cited

U.S. PATENT DOCUMENTS 6,937,494 B2 * 8/2005 Funaba et al. ................ 365/63
7,072,201 B2 * 7/2006 So et al. ....................... 365/63

* cited by examiner

*Primary Examiner*—Pho M. Luu
(74) *Attorney, Agent, or Firm*—Slater & Matsil, L.L.P.

(57) ABSTRACT

A semiconductor memory module (1) includes a circuit substrate (2), a first (100), a second (200), a third (300) and a fourth (400) rank of memory chips (3), a first register (10) and a second register (20). The first register (10) and the second register (20) each comprise a first input (11, 21) for receiving a respective chip select signal (CS0, CS2), a second input (12, 22) for receiving a respective other chip select signal (CS1, CS3) at least one third input (13, 23) for receiving command/address signals (CA), and at least one third output (16, 26). The at least one third output (16, 26) of the respective first (10) and second (20) register transmits the command/address signals (CA), if at least one of the respective chip select signal (CS0, CS2) received at the respective first input (11, 21) of the respective register (10, 20) and the respective other chip select signal (CS1, CS3) received at the respective second input (12, 22) of the respective register (10, 20) is active, and blocks a transmission of the command/address signals (CA), if both the respective chip select signal (CS0, CS2) received at the respective first input (11, 21) of the respective register (10, 20) and the respective other chip select signal (CS1, CS3) received at the respective second input (12, 22) of the respective register (10, 20) are inactive.

36 Claims, 5 Drawing Sheets

SEMICONDUCTOR MEMORY MODULE AND ELECTRONIC APPARATUS INCLUDING A SEMICONDUCTOR MEMORY MODULE AND METHOD FOR OPERATING THEREOF

TECHNICAL FIELD

The present invention relates to semiconductor memory modules and electronic apparatuses comprising a semiconductor memory module and more specifically to semiconductor memory modules consuming low power.

BACKGROUND

Computer systems typically have a processing unit and a memory system connected to it for storing data. The memory system includes a memory controller and one or more semiconductor memory modules. The processing unit is connected to the memory controller via a bus system and the memory controller is coupled to the semiconductor memory modules via a memory bus system. Each of the semiconductor memory modules comprises at least one register and a number of ranks of memory chips coupled to the register. The registers transmit command/address signals and chip select signals received from the memory controller to the ranks of memory chips. For selecting a specific rank of memory chips for a memory access, respective chip select signals are used to activate the respective rank. Typically, command/address inputs of memory chips of several ranks are coupled in parallel to one output of a single register. The register transmits command/address signals to the respective ranks of memory chips if at least one of the respective chip select signals is active. Therefore, command/address signals are transmitted unnecessarily to ranks of memory chips coupled to the register but not being addressed by a memory access.

Due to the capacitance of the memory chips and the lines coupling the memory chips with the register, power is consumed by the semiconductor memory module each time data signals are transmitted. Therefore, power is wasted during each memory access when transmitting command/address signals to a number of ranks of memory chips that are not addressed.

In addition, due to the increasing operating speed of the semiconductor memory modules, the power consumption further increases.

What is desired is a semiconductor memory module and an electronic apparatus comprising a memory module that consumes low power and a method of operating thereof.

SUMMARY OF THE INVENTION

One embodiment of the present invention provides a semiconductor memory module that includes a circuit substrate, a first, a second, a third and a fourth rank of memory chips each including a multiplicity of memory chips and each being disposed on the circuit substrate. The semiconductor memory module further includes a first register and a second register each disposed on the circuit substrate, wherein the first register and the second register each comprise a first input for receiving a respective chip select signal having one of an active and an inactive level, a second input for receiving a respective other chip select signal having one of an active and an inactive level, at least one third input for receiving command/address signals, a first output for transmitting the respective chip select signal to the memory chips of the first rank and the third rank, respectively, a second output for transmitting the respective other chip select signal to the memory chips of the second rank and the fourth rank, respectively, and at least one third output.

The at least one third output of the first register transmits the command/address signals to the memory chips of the first rank and to the memory chips of the second rank, if at least one of the chip select signal received at the first input of the first register and the other chip select signal received at the second input of the first register is active, and blocks a transmission/switching of the command/address signals to the memory chips of the first rank and to the memory chips of the second rank, if both the chip select signal received at the first input of the first register and the other chip select signal received at the second input of the first register are inactive.

The at least one third output of the second register transmits the command/address signals to the memory chips of the third rank and to the memory chips of the fourth rank, if at least one of the chip select signal received at the first input of the second register and the other chip select signal received at the second input of the second register is active, and blocks a transmission/switching of the command/address signals to the memory chips of the third rank and to the memory chips of the fourth rank, if both the chip select signal received at the first input of the second register and the other chip select signal received at the second input of the second register are inactive.

Another aspect of the present invention provides an electronic apparatus including a controller device, a bus system and at least one semiconductor memory module. The semiconductor memory module includes a circuit substrate, a first, a second, a third and a fourth rank of memory chips each including a multiplicity of memory chips and each being disposed on the circuit substrate. The semiconductor memory module further includes a first register and a second register each disposed on the circuit substrate, wherein the first register and the second register each include a first input coupled to the controller device for receiving a respective chip select signal having one of an active and an inactive level, a second input coupled to the controller device for receiving a respective other chip select signal having one of an active and an inactive level, at least one third input coupled to the controller device via the bus system for receiving command/address signals, a first output for transmitting the respective chip select signal to the memory chips of the first rank and the third rank, respectively, a second output for transmitting the respective other chip select signal to the memory chips of the second rank and the fourth rank, respectively, and at least one third output.

The at least one third output of the first register transmits the command/address signals to the memory chips of the first rank and to the memory chips of the second rank, if at least one of the chip select signal received at the first input of the first register and the other chip select signal received at the second input of the first register is active, and blocks a transmission/switching of the command/address signals to the memory chips of the first rank and to the memory chips of the second rank, if both the chip select signal received at the first input of the first register and the other chip select signal received at the second input of the first register are inactive.

The at least one third output of the second register transmits the command/address signals to the memory chips of the third rank and to the memory chips of the fourth rank, if at least one of the chip select signal received at the first input of the second register and the other chip select signal received at the second input of the second register is active, and blocks a transmission/switching of the command/address signals to the memory chips of the third rank and to the memory chips of the fourth rank, if both the chip select signal received at the first input of the second register and the other chip select signal received at the second input of the second register are inactive.

Another aspect of the present invention provides a method of operating a semiconductor memory module. The method includes providing a semiconductor memory module, wherein the semiconductor memory module includes a circuit substrate, a first, a second, a third and a fourth rank of memory chips, each including a multiplicity of memory chips and each being disposed on the circuit substrate. The semiconductor memory module further includes a first register and a second register each disposed on the circuit substrate, wherein the first register and the second register each include a first input for receiving a respective chip select signal having one of an active and an inactive level, a second input for receiving a respective other chip select signal having one of an active and an inactive level, at least one third input for receiving command/address signals, a first output for transmitting the respective chip select signal to the memory chips of the first rank and the third rank, respectively, a second output for transmitting the respective other chip select signal to the memory chips of the second rank and the fourth rank, respectively, and at least one third output.

The method further includes determining, if of one of the respective chip select signals and one of the respective other chip select signals is active, transmitting/switching the command/address signals to the memory chips of the first rank and to the memory chips of the second rank via the at least one third output of the first register, if at least one of the chip select signal received at the first input of the first register and the other chip select signal received at the second input of the first register is active, and blocking a transmission/switching of the command/address signals to the memory chips of the first rank and to the memory chips of the second rank, if both the chip select signal received at the first input of the first register and the other chip select signal received at the second input of the first register are inactive.

The method further includes transmitting/switching the command/address signals via the at least one third output of the second register to the memory chips of the third rank and to the memory chips of the fourth rank, if at least one of the chip select signal received at the first input of the second register and the other chip select signal received at the second input of the second register is active, and blocking a transmission/switching of the command/address signals to the memory chips of the third rank and to the memory chips of the fourth rank, if both the chip select signal received at the first input of the second register and the other chip select signal received at the second input of the second register are inactive.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
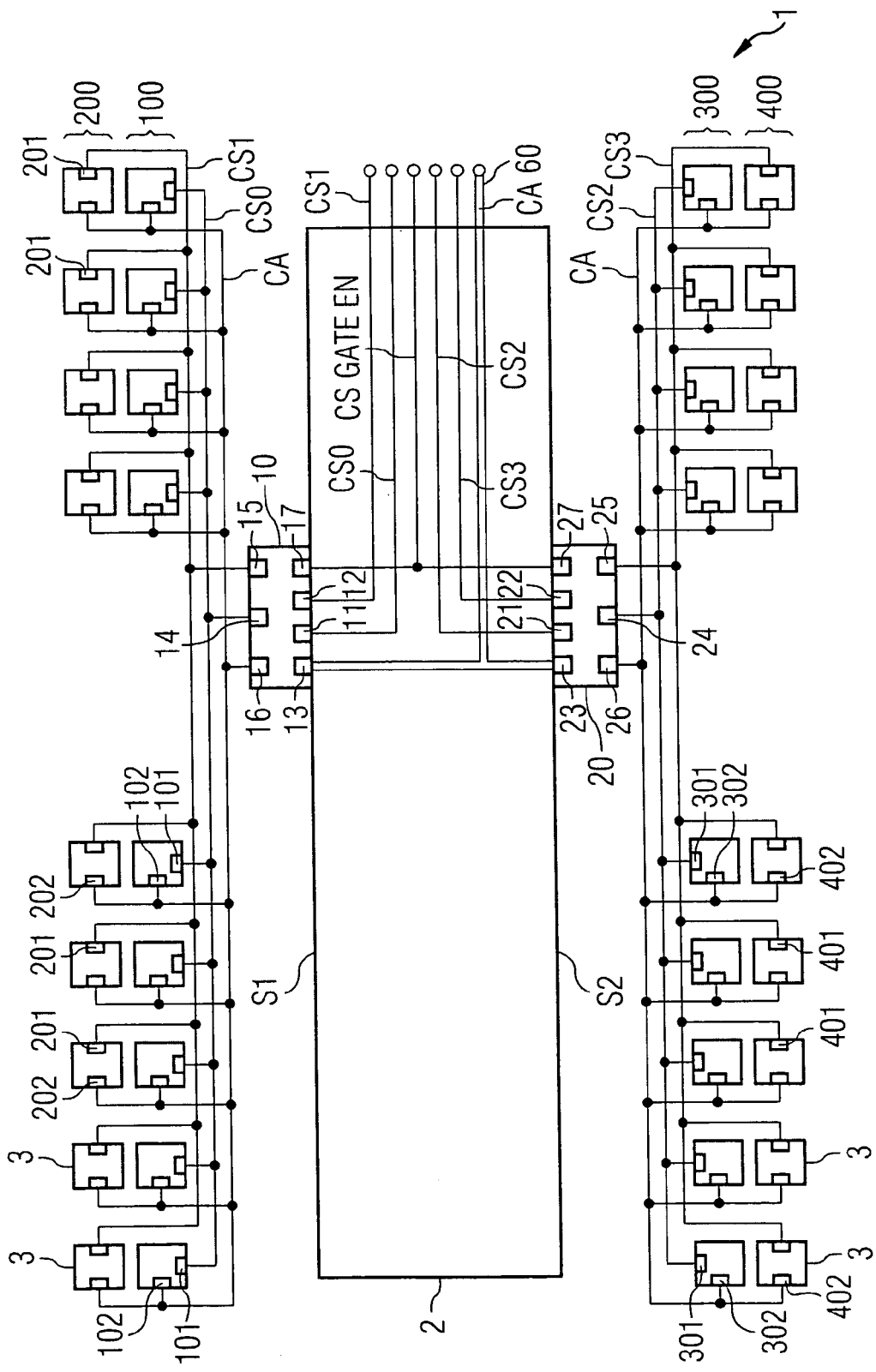
FIG. 1 depicts schematically a semiconductor memory module according to one embodiment of the present invention.

FIG. 1 depicts schematically a semiconductor memory module 1 according to one embodiment of the present invention. The semiconductor memory module 1 comprises a circuit substrate 2 having a first surface S1 and a second surface S2. The circuit substrate 2 is preferably a circuit board, e.g., a printed circuit board with conductive lines disposed thereon.

A first register 10, a first rank 100 and a second rank 200 of memory chips 3 are disposed on the first surface S1. In FIG. 1, each of the first rank 100 and the second rank 200 of memory chips 3 includes nine memory chips 3. However, the first rank 100 and the second rank 200 may each include eighteen memory chips 3. Each of the first 100 and second 200 ranks of memory chips 3 comprises a multiplicity of memory chips 3. In this embodiment, the memory chips 3 are stacked upon each other and more specifically, the memory chips 3 of the second rank 200 are stacked upon memory chips 3 of the first rank 100. However, memory chips 3 of the first rank 100 and of the second rank 200 may be arranged in a single layer on the first surface S1 of the circuit substrate 2.

The first register 10 has a first input 11 for receiving a chip select signal CS0, a second input 12 for receiving a chip select signal CS1, at least one third input 13 for receiving command/address signals CA and a fourth input 17 for receiving a control signal CS GATE EN. The command/address signals CA may be transmitted by a bus system 60. Furthermore, the first register has a first output 14, a second output 15 and at least one third output 16. Chip select inputs 101 of memory chips 3 of the first rank 100 are coupled in parallel to the first output 14 of the first register 10 for transmitting the chip select signal CS0 from the first register 10 to the memory chips 3 of the first rank 100. Chip select inputs 201 of the memory chips 3 of the second rank 200 are coupled in parallel to the second output 15 of the first register 10 for transmitting the chip select signal CS1 from the first register 10 to the memory chips 3 of the second rank 200. Command/address inputs 102, 202 of the memory chips 3 of the first rank 100 and of the second rank 200 are coupled in parallel to the at least one third output 16 of the first register 10 for transmitting/switching command/address signals CA from the first register 10 to the memory chips 3 of the first rank 100 and of the second rank 200. In FIG. 1, a connection between the at least one third output 16 of the first register 10 with the memory chips 3 of the first rank 100 and with the memory chips 3 of the second rank 200 is illustrated by a single line for reasons of better clearness. However, the connection may be provided by a bus system.

A second register 20, a third rank 300 and a fourth rank 400 of memory chips 3 are disposed on the second surface S2. In FIG. 1, each of the third rank 300 and the fourth rank 400 of memory chips 3 includes nine memory chips 3. However, the third rank 300 and the fourth rank 400 may each include eighteen memory chips 3. Each of the third 300 and fourth 400 ranks of memory chips 3 includes a multiplicity of memory chips 3. In this embodiment, the memory chips 3 are stacked upon each other and more specifically, the memory chips 3 of the fourth rank 400 are stacked upon memory chips 3 of the third rank 300. However, memory chips 3 of the third rank 300 and of the fourth rank 400 may be arranged in a single layer on the second surface S2 of the circuit substrate 2.

The second register 20 has a first input 21 for receiving a chip select signal CS2, a second input 22 for receiving a chip select signal CS3, at least one third input 23 for receiving command/address signals CA and a fourth input 27 for receiving a control signal CS GATE EN. Furthermore, the second register 20 has a first output 24, a second output 25 and at least one third output 26. Chip select inputs 301 of memory chips 3 of the third rank 300 are coupled in parallel to the first output 24 of the second register 20 for transmitting the chip select signal CS2 from the second register 20 to the memory chips 3 of the third rank 300. Chip select inputs 401 of memory chips 3 of the fourth rank 400 are coupled in parallel to the second output 25 of the second register 20 for transmitting the chip select signal CS3 from the second register 20 to the memory chips 3 of the fourth rank 400. Command/address inputs 302, 402 of the memory chips 3 of the third rank 300 and of the fourth rank 400 are coupled in parallel to the at least one third output 26 of the second register for transmitting/switching command/address signals to the memory chips 3 of the third rank 300 and of the fourth rank 400. In FIG. 1, a connection between the at least one third output 26 of the second register 20 with the memory chips 3 of the third rank 300 and with the memory chips 3 of the fourth rank 400 is illustrated by a single line for reasons of better clearness. However, the connection may be provided by a bus system.

Preferably memory chips 3 are DRAM memory chips providing a dynamic random access. However, other memory chips such as SDRAM memory chips may be used.

A memory chip can be activated by applying an active chip select signal to the chip select input of the memory chip. To activate the memory chip, a value of 0 is sent to the chip select input of the memory chips. If a value of 1 is applied to the chip select input of the memory chip, the memory chip is inactive. The use of chip select signals allows selecting specific chips/ranks during a memory access for reading data from the memory chip or writing data to the memory chip.

The control signal CS GATE EN is coupled to the fourth input 17 of the first register 10 and to the fourth input 27 of the second register 20 in parallel and may be provided by a motherboard of a computer.

The control signal CS GATE EN has one of an active and an inactive level. The semiconductor memory module can be operated in a first mode relating to this signal being inactive and in a second mode relating to the control signal being active.

In the first mode of operation, an inactive level of the control signal CS GATE EN is applied to the fourth input 17 of the first register 10 and to the fourth input 27 of the second register 20. The command/address signals CA applied to the at least one third input 13 of the first register 10 are transmitted via the at least one third output 16 of the first register 10 to the memory chips 3 of the first rank 100 and of the second rank 200, and the command/address signals CA applied to the at least one third input 23 of the second register 20 are transmitted via the at least one third output 26 of the second register 20 to the memory chips 3 of the third rank 300 and of the fourth rank 400.

In the second mode of operation, an active level of the control signal CS GATE EN is applied to the fourth input 17 of the first register 10. The transmission of command/address signals CA applied to the at least one third input 13 to memory chips 3 via the at least one third output 16 is dependent on the level of the chip select signals CS0 and CS1. If at least one of the chip select signals CS0 and CS1 is active, then the command/address signals CA are transmitted via the at least one third output 16 to the memory chips 3 of the first rank 100 and of the second rank 200. If both chip select signals CS0 and CS1 are inactive, then the transmission of the command/address signals CA via the at least one third output 16 to the memory chips 3 of the first rank 100 and of the second rank 200 is blocked.

Furthermore, in the second mode of operation, an active level of the control signal CS GATE EN is applied to the fourth input 27 of the second register 20. The transmission of command/address signals CA applied to the at least one third input 23 to memory chips 3 via the at least one third output 26 is dependent on the level of the chip select signals CS2 and CS3. If at least one of the chip select signals CS2 and CS3 is active, then the command/address signals CA are transmitted via the at least one third output 26 to the memory chips 3 of the third rank 300 and of the fourth rank 400. If both chip select signals CS2 and CS3 are inactive, then the transmission of the command/address signals CA via the at least one third output 26 to the memory chips 3 of the third rank 300 and of the fourth rank 400 is blocked.

Accordingly, in the second mode of operation, the respective at least one third output 16, 26 of each of the first 10 and second 20 registers drives the command/address signals CA only when the register 10, 20 receives a chip select signal that refers to a rank that is connected to the respective register 10, 20. Therefore, the power consumed during a memory access in which only ranks connected to a single register are addressed, is reduced. This reduction of power consumption also reduces the heat generated in the semiconductor memory module 1 and, therefore, less cooling, e.g., provided by an air flow, of the semiconductor memory module is required. This advantageously reduces the cost of the semiconductor memory module and the maintenance costs.

Figure 2:
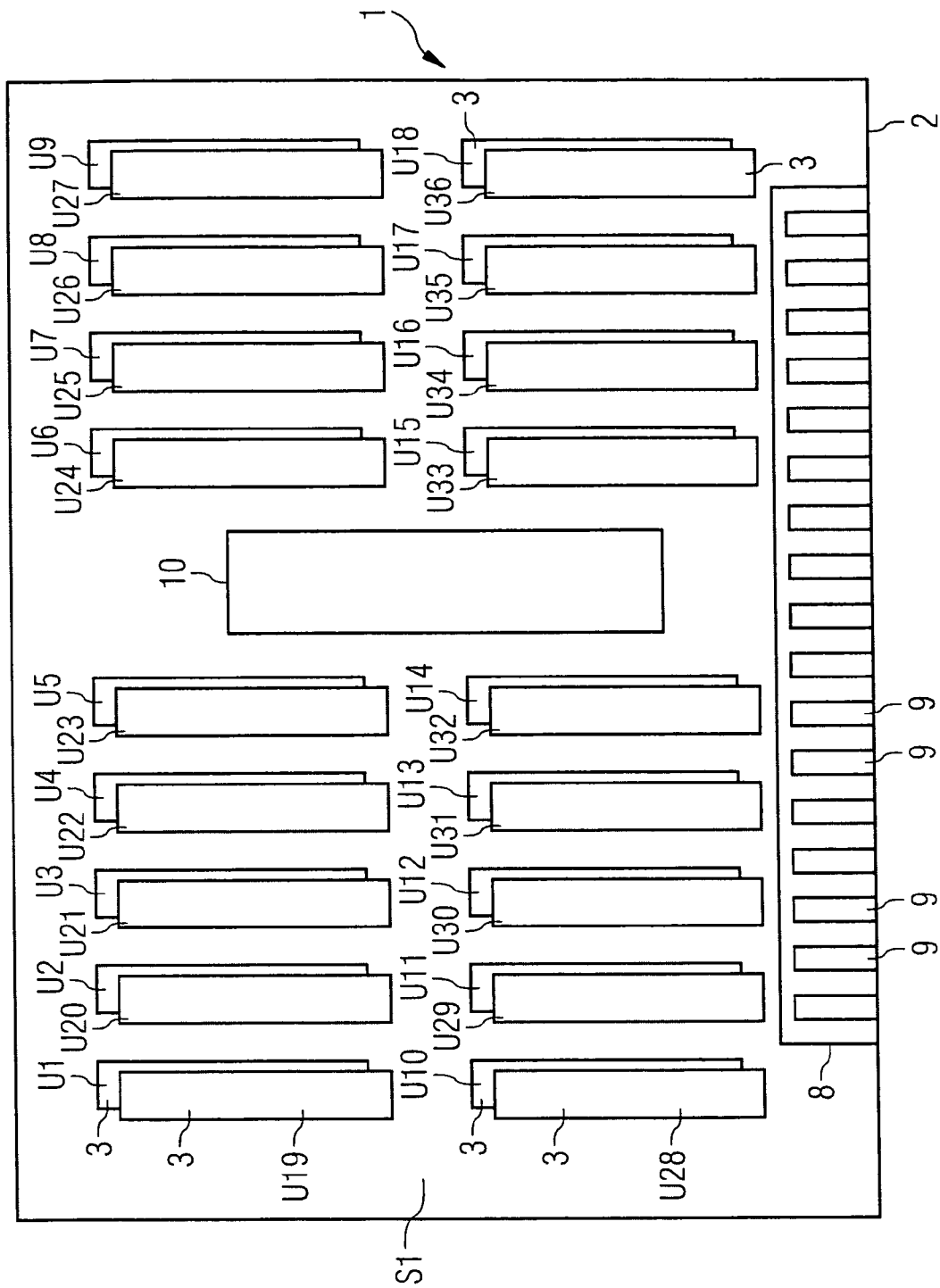
FIG. 2 depicts a plan view of the semiconductor memory module as depicted in FIG. 1.

FIG. 2 depicts a plan view of the semiconductor memory module 1 as depicted in FIG. 1. Memory chips 3 are mounted on a first surface S1 of a circuit substrate 2. In this embodiment, memory chips 3 are labeled U1 to U36. Memory chips U1 to U36 are arranged in two levels. Memory chips U1 to U18 are mounted on the circuit substrate 2 and memory chips U19 to U36 are stacked upon memory chips U1 to U18. By stacking the memory chips upon another, the density of memory chips on the circuit substrate 2 is increased. Memory chips U1 to U36 are grouped in ranks of memory chips. In this embodiment a first rank 100 comprises memory chips U1 to U18 and a second rank 200 of memory chips comprises memory chips U19 to U36. However, other compositions of the first 100 and second ranks 200 are possible. It is also possible that U1 to U36 are thirty-six stacked chips, wherein U1 to U18 are placed on the first surface S1 of the circuit substrate 2 and U19 to U36 are placed on a second surface (not shown in FIG. 2) of the circuit substrate 2.

An edge connector 8 having pins 9 is disposed at a long end of the circuit substrate 2. The edge connector 8 provides a connection between the semiconductor memory module 1 and an external device such as a controller device by, for example, a bus system. One end of each of the pins 9 is coupled to register 10 by conductive lines (not shown)

disposed on the circuit substrate 2 for the transmission of electrical signals. Another end of each of the pins 9 provides a connection to a socket of an external device.

Figure 3:
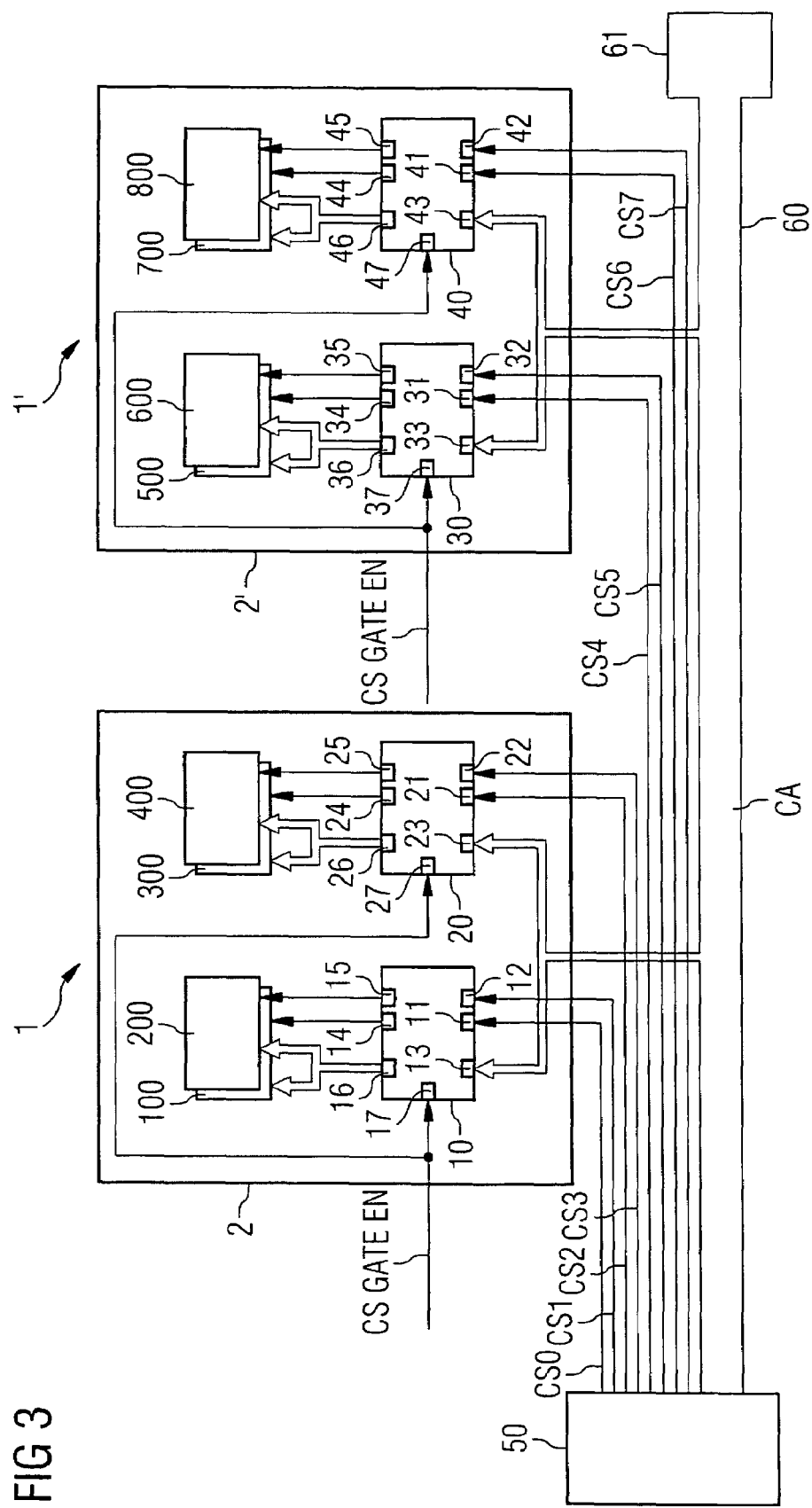
FIG. 3 depicts schematically an electronic apparatus according to one embodiment of the present invention.

FIG. 3 depicts schematically an electronic apparatus according to one embodiment of the present invention. The electronic apparatus includes a first semiconductor memory module 1, a second semiconductor memory module 1', a controller device 50 and a bus system 60.

First 1 and second 1' semiconductor memory modules are coupled to the controller device 50 via the bus system 60 for the transmission of electrical signals, e.g., command/address signals CA. First 1 and second 1' semiconductor memory modules preferably include a connector such as an edge connector (not shown in FIG. 3) for connecting to bus system 60. Typically, the bus system 60 comprises sockets (not shown in FIG. 3) in which first 1 and second 1' semiconductor memory modules are plugged in. The bus system 60 may include a multiplicity of sockets for connecting a multiplicity of semiconductor memory modules to the controller device 50. A bus termination 61 disposed at the end of the bus system 60 terminates the bus system 60.

Each of the first 1 and second 1' semiconductor memory modules includes a first register 10, 30, a second register 20, 40, a first 100, 500, a second 200, 600, a third 300, 700 and a fourth rank 400, 800 of memory chips (not shown in FIG. 3).

Each of the first 10, 30 and second 20, 40 registers of the first 1 and second 1' semiconductor memory modules have a first input 11, 21, 31, 41 coupled to the controller circuit 50 for receiving a respective chip select signal CS0, CS2, CS4, CS6, a second input 12, 22, 32, 42 coupled to the controller circuit 50 for receiving a respective other chip select signal CS1, CS3, CS5, CS7 and at least one third input 13, 23, 33, 43 coupled to the controller circuit 50 for receiving command/address signals CA.

Each of the first 10, 30 and second 20, 40 registers of the first 1 and second 1' semiconductor memory modules have a respective fourth input 17, 27, 37, 47 for receiving a control signal CS GATE EN. The control signal CS GATE EN is coupled to the fourth inputs 17, 27, 37, 47 in parallel and may be provided by a motherboard of a computer or may be wired on the semiconductor memory module 1 itself.

Furthermore, each of the first 10, 30 and second 20, 40 registers of the first 1 and second 1' semiconductor memory modules have a first output 14, 24, 34, 44, a second output 15, 25, 35, 45 and at least one third output 16, 26, 36, 46.

Chip select inputs of memory chips (not shown in FIG. 3) of the first rank 100 of the first semiconductor memory module 1 are coupled to the first output 14 of the first register 10 of the first semiconductor memory module 1 for the transmission of the chip select signal CS0 to the memory chips (not shown in FIG. 3) of the first rank 100 of the first semiconductor memory module 1.

Chip select inputs of memory chips (not shown in FIG. 3) of the second rank 200 of the first semiconductor memory module 1 are coupled to the second output 15 of the first register 10 of the first semiconductor memory module 1 for the transmission of the chip select signal CS1 to the memory chips (not shown in FIG. 3) of the second rank 200 of the first semiconductor memory module 1.

Chip select inputs of memory chips (not shown in FIG. 3) of the third rank 300 of the first semiconductor memory module 1 are coupled to the first output 24 of the second register 20 of the first semiconductor memory module 1 for the transmission of the chip select signal CS2 to memory chips (not shown in FIG. 3) of the third rank 300 of semiconductor the first memory module 1.

Chip select inputs of memory chips (not shown in FIG. 3) of the fourth rank 400 of the first semiconductor memory module 1 are coupled to the second output 25 of the second register 20 of the first semiconductor memory module 1 for the transmission of the chip select signal CS3 to the memory chips (not shown in FIG. 3) of the fourth rank 400 of first semiconductor memory module 1.

Chip select inputs of memory chips (not shown in FIG. 3) of the first rank 500 of the second semiconductor memory module 1' are coupled to the first output 34 of the first register 30 of the second semiconductor memory module 1' for the transmission of the chip select signal CS4 to the memory chips (not shown in FIG. 3) of the first rank 500 of the second semiconductor memory module 1'.

Chip select inputs of memory chips (not shown in FIG. 3) of the second rank 600 of the second semiconductor memory module 1' are coupled to the second output 35 of the first register 30 of the second semiconductor memory module 1' for the transmission of the chip select signal CS5 to the memory chips (not shown in FIG. 3) of the second rank 600 of the second semiconductor memory module 1'.

Chip select inputs of memory chips (not shown in FIG. 3) of the third rank 700 of the second semiconductor memory module 1' are coupled to the first output 44 of the second register 40 of the second semiconductor memory module 1' for the transmission of the chip select signal CS6 to the memory chips (not shown in FIG. 3) of the third rank 700 of the second semiconductor memory module 1'.

Chip select inputs of memory chips (not shown in FIG. 3) of the fourth rank 800 of the second semiconductor memory module 1' are coupled to the second output 45 of the second register 40 of the second semiconductor memory module 1' for the transmission of the chip select signal CS7 to the memory chips (not shown in FIG. 3) of the fourth rank 800 of the second semiconductor memory module 1'.

Command/address inputs of memory chips (not shown in FIG. 3) of the first rank 100 and of the second rank 200 of the first semiconductor memory module 1 are coupled in parallel to the at least one third output 16 of the first register 10 of the first semiconductor memory module 1 for the transmission of command/address signals to the memory chips (not shown in FIG. 3) of the first rank 100 and of the second rank 200 of the first semiconductor memory module 1.

Command/address inputs of memory chips (not shown in FIG. 3) of the third rank 300 and of the fourth rank 400 of the first semiconductor memory module 1 are coupled in parallel to the at least one third output 26 of the second register 20 of the first semiconductor memory module 1 for the transmission of command/address signals to the memory chips (not shown in FIG. 3) of the third rank 300 and of the fourth rank 400 of the first semiconductor memory module 1.

Command/address inputs of memory chips (not shown in FIG. 3) of the first rank 500 and of the second rank 600 of the second semiconductor memory module 1' are coupled in parallel to the at least one third output 36 of the first register 30 of the second semiconductor memory module 1' for the transmission of command/address signals to the memory chips (not shown in FIG. 3) of the first rank 500 and of the second rank 600 of the second semiconductor memory module 1'.

Command/address inputs of memory chips (not shown in FIG. 3) of the third rank 700 and of the fourth rank 800 of the second semiconductor memory module 1' are coupled in parallel to the at least one third output 46 of the second register 40 of the second semiconductor memory module 1' for the transmission of command/address signals to the memory chips (not shown in FIG. 3) of the third rank 700 and of the fourth rank 800 of the second semiconductor memory module 1'.

If an inactive level of the control signal CS GATE EN is applied to each of the fourth inputs 17, 27, 37, 47 of the respective first 10, 30 and second 20, 40 registers of the respective first 1 and second 1' semiconductor memory modules, then the command/address signals CA applied to the at least one third input 13 of the first register 10 of the first semiconductor memory module 1 are transmitted via the at least one third output 16 of the first register 10 of the first semiconductor memory module 1 to the memory chips 3 of the first rank 100 and of the second rank 200 of the first semiconductor memory module 1, the command/address signals CA applied to the at least one third input 23 of the second register 20 of the first semiconductor memory module 1 are transmitted via the at least one third output 26 of the second register 20 of the first semiconductor memory module 1 to the memory chips 3 of the third rank 300 and of the fourth rank 400 of the first semiconductor memory module 1, the command/address signals CA applied to the at least one third input 33 of the first register 30 of the second semiconductor memory module 1' are transmitted via the at least one third output 36 of the first register 30 of the second semiconductor memory module 1' to the memory chips 3 of the first rank 500 and of the second rank 600 of the second semiconductor memory module 1', the command/address signals CA applied to the at least one third input 43 of the second register 40 of the second semiconductor memory module 1' are transmitted via the at least one third output 46 of the second register 40 of the second semiconductor memory module 1' to the memory chips 3 of the third rank 700 and of the fourth rank 800 of the second semiconductor memory module 1'.

If an active level of the control signal CS GATE EN is applied to each of the fourth input 17, 27, 37, 47 of the respective first 10, 30 and second 20, 40 registers of the respective first 1 and second 1' semiconductor memory modules, then the transmission of command/address signals CA applied to respective at least one third inputs 13, 23, 33, 43 is dependent on the respective chip select signals CS0 to CS7.

If at least one of the chip select signals CS0 and CS1 coupled respectively to the first input 11 and the second input 12 of the first register 10 of the first semiconductor memory module 1 is active, then the command/address signals CA are transmitted via the at least one third output 16 to the memory chips 3 of the first rank 100 and of the second rank 200 of the first semiconductor memory module 1. If both chip select signals CS0 and CS1 are inactive, then the transmission of command/address signals CA via the at least one third output 16 to the memory chips 3 of the first rank 100 and of the second rank 200 is blocked.

If at least one of the chip select signals CS2 and CS3 coupled respectively to the first input 21 and the second input 22 of the second register 20 of the first semiconductor memory module 1 is active, then the command/address signals CA are transmitted via the at least one third output 26 to the memory chips 3 of the third rank 300 and of the fourth rank 400 of the first semiconductor memory module 1. If both chip select signals CS2 and CS3 are inactive, then the transmission of command/address signals CA via the at least one third output 26 to the memory chips 3 of the third rank 300 and of the fourth rank 400 is blocked.

If at least one of the chip select signals CS4 and CS5 coupled respectively to the first input 31 and the second input 32 of the first register 30 of the second semiconductor memory module 1' is active, then the command/address signals CA are transmitted via the at least one third output 36 to the memory chips 3 of the first rank 500 and of the second rank 600 of the second semiconductor memory module 1'. If both chip select signals CS4 and CS5 are inactive, then the transmission of command/address signals CA via the at least one third output 36 to the memory chips 3 of the first rank 500 and of the second rank 600 is blocked.

If at least one of the chip select signals CS6 and CS7 coupled to the respective first input 41 and the second input 42 of the second register 40 of the second semiconductor memory module 1' is active, then the command/address signals CA are transmitted via the at least one third output 46 to the memory chips 3 of the third rank 700 and of the fourth rank 800 of the second semiconductor memory module 1'. If both chip select signals CS6 and CS7 are inactive, then the transmission of command/address signals CA via the at least one third output 46 to the memory chips 3 of the third rank 700 and of the fourth rank 800 is blocked.

Figure 4:
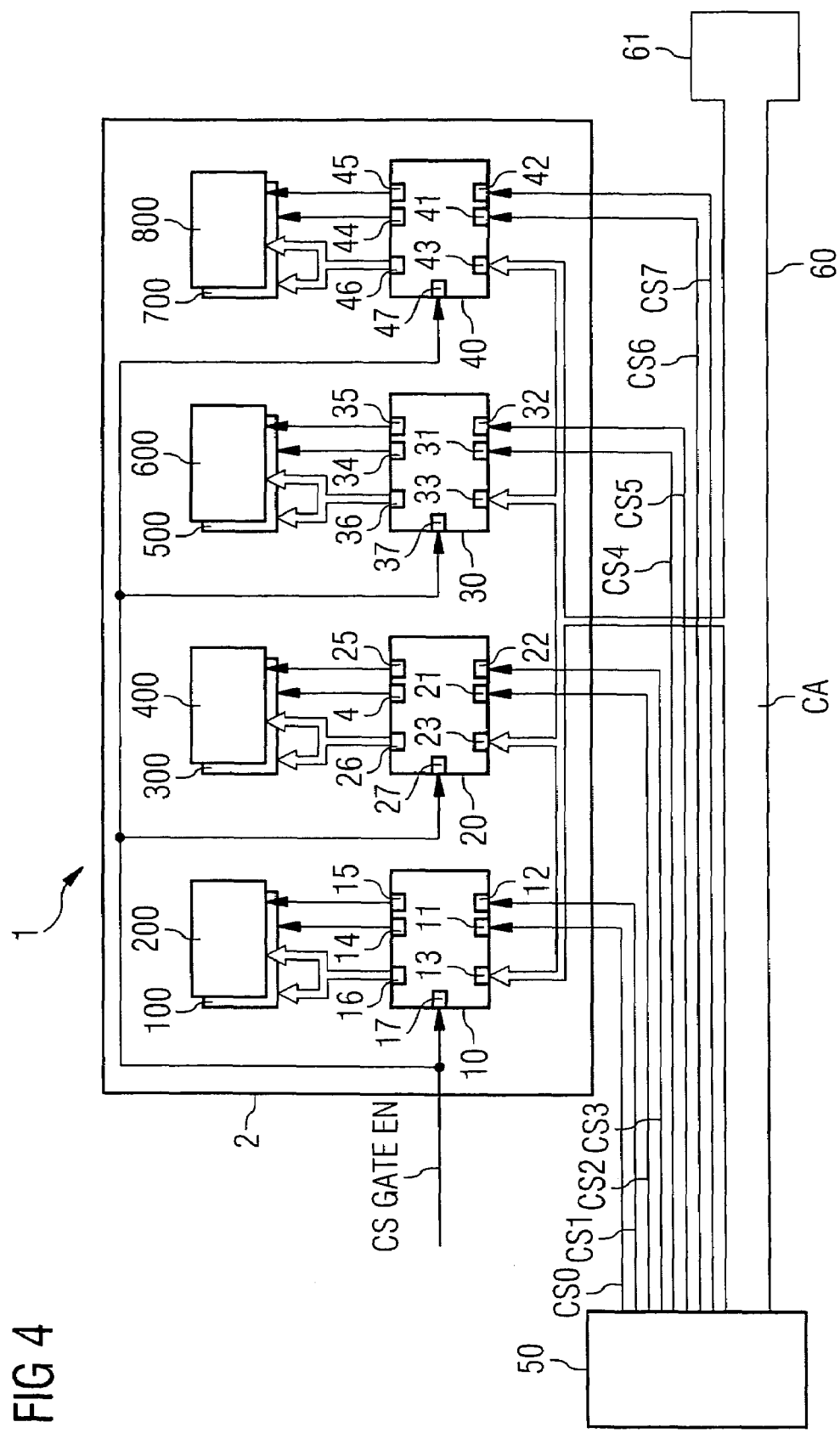
FIG. 4 depicts schematically an electronic apparatus according to one embodiment of the present invention.

FIG. 4 depicts schematically an electronic apparatus according to one embodiment of the invention. The electronic apparatus includes a semiconductor memory module 1, a bus system 60 and a controller device 50 such as a memory controller.

The semiconductor memory module 1 includes a first 100, a second 200, a third 300, a fourth 400, a fifth 500, a sixth 600, a seventh 700 and an eighth 800 rank of memory chips disposed. Furthermore, the semiconductor memory module 1 includes a first 10, a second 20, a third 30 and a fourth 40 register.

Each of the first 10, second 20, third 30 and fourth 40 register has a respective first input 11, 21, 31, 41 coupled to the controller device 50 for receiving a respective chip select signal CS0, CS2, CS4, CS6, CS8, a respective second input 12, 22, 32, 42 coupled to the controller device 50 for receiving another respective chip select signal CS1, CS3, CS5, CS7, and at least one third input 13, 23, 33, 43 coupled to the controller device 50 for receiving command/address signals CA.

Each of the first 10, second 20, third 30 and fourth 40 register has a respective fourth input 17, 27, 37, 47 for receiving a control signal CS GATE EN, wherein the control signal CS GATE EN is coupled to the fourth inputs 17, 27, 37 and 47 in parallel.

Furthermore, each of the first 10, second 20, third 30 and fourth 40 register has a respective first output 14, 24, 34, 44, a respective second output 15, 25, 35, 45 and at least one respective third output 16, 26, 36, 46. Chip select inputs of memory chips (not shown in FIG. 4) of the first rank 100 are coupled to the first output 14 of the first register 10 for the transmission of the chip select signal CS0, chip select inputs of the memory chips (not shown in FIG. 4) of the second rank 200 are coupled to the second output 15 of the first register 10 for the transmission of the chip select signal CS1, chip select inputs of the memory chips of the third rank 300 are coupled to the first output 24 of the second register 20 for the transmission of the chip select signal CS2, chip select inputs of the memory chips (not shown in FIG. 4) of the fourth rank 400 are coupled to the second output 25 of the second register 20 for the transmission of the chip select signal CS3, chip select inputs of the memory chips (not shown in FIG. 4) of the fifth rank 500 are coupled to the first output 34 of the third register 30 for the transmission of the chip select signal CS4, chip select inputs of the memory chips (not shown in FIG. 4) of the sixth rank 600 are coupled to the second output 35 of the third register 30 for the transmission of the chip select signal CS5, chip select inputs of the memory chips (not shown in FIG. 4) of the seventh rank 700 are coupled to the first output 44 of the fourth register 40 for the transmission of the chip select signal CS6, and chip select inputs of the memory chips (not shown in FIG. 4) of the eighth rank 800 are coupled to the second output 45 of the fourth register 40 for the transmission of the chip select signal CS7.

Command/address inputs of memory chips (not shown in FIG. 4) of the first rank 100 and of the second rank 200 are coupled in parallel to the at least one third output 16 of the first register 10 for the transmission of command/address signals to the memory chips (not shown in FIG. 4) of the first rank 100 and of the second rank 200.

Command/address inputs of memory chips (not shown in FIG. 4) of the third rank 300 and of the fourth rank 400 are coupled in parallel to the at least one third output 26 of the second register 20 for the transmission of command/address signals to the memory chips (not shown in FIG. 4) of the third rank 300 and of the fourth rank 400.

Command/address inputs of memory chips (not shown in FIG. 4) of the first rank 500 and of the second rank 600 are coupled in parallel to the at least one third output 36 of the third register 30 for the transmission of command/address signals to the memory chips (not shown in FIG. 4) of the fifth rank 500 and of the sixth rank 600.

Command/address inputs of memory chips (not shown in FIG. 4) of the seventh rank 700 and of the eighth rank 800 are coupled in parallel to the at least one third output 46 of the fourth register 40 for the transmission of command/address signals to the memory chips (not shown in FIG. 4) of the seventh rank 700 and of the eighth rank 800.

If an inactive level of the control signal CS GATE EN is applied to each of the fourth inputs 17, 27, 37, 47 of the respective first 10, second 20, third 30, fourth 40, fifth 50, sixth 60, seventh 70 and eighth 80 registers, then the command/address signals CA applied to the at least one third input 13 of the first register 10 are transmitted via the at least one third output 16 of the first register 10 to the memory chips 3 of the first rank 100 and of the second rank 200, the command/address signals CA applied to the at least one third input 23 of the second register 20 are transmitted via the at least one third output 26 of the second register 20 to the memory chips 3 of the third rank 300 and of the fourth rank 400, the command/address signals CA applied to the at least one third input 33 of the third register 30 are transmitted via the at least one third output 36 of the third register 30 to the memory chips 3 of the fifth rank 500 and of the sixth rank 600, the command/address signals CA applied to the at least one third input 43 of the fourth register 40 are transmitted via the at least one third output 46 of the fourth register 40 to the memory chips 3 of the seventh rank 700 and of the eighth rank 800.

If an active level of the control signal CS GATE EN is applied to each of the fourth input 17, 27, 37, 47 of the respective first 10, second 20, third 30, fourth 40, fifth 50, sixth 60, seventh 70 and eighth 80 registers, then the transmission of command/address signals CA applied to respective at least one third inputs 13, 23, 33, 43 is dependent on the respective chip select signals CS0 to CS7.

If at least one of the chip select signals CS0 and CS1 coupled respectively to the first input 11 and the second input 12 of the first register 10 is active, then the command/address signals CA are transmitted via the at least one third output 16 to the memory chips 3 of the first rank 100 and of the second rank 200. If both chip select signals CS0 and CS1 are inactive, then the transmission of command/address signals CA via the at least one third output 16 to the memory chips 3 of the first rank 100 and of the second rank 200 is blocked.

If at least one of the chip select signals CS2 and CS3 coupled respectively to the first input 21 and the second input 22 of the second register 20 is active, then the command/address signals CA are transmitted via the at least one third output 26 to the memory chips 3 of the third rank 300 and of the fourth rank 400. If both chip select signals CS2 and CS3 are inactive, then the transmission of command/address signals CA via the at least one third output 26 to the memory chips 3 of the third rank 300 and of the fourth rank 400 is blocked.

If at least one of the chip select signals CS4 and CS5 coupled respectively to the first input 31 and the second input 32 of the third register 30 is active, then the command/address signals CA are transmitted via the at least one third output 36 to the memory chips 3 of the fifth rank 500 and of the sixth rank 600. If both chip select signals CS4 and CS5 are inactive, then the transmission of command/address signals CA via the at least one third output 36 to the memory chips 3 of the fifth rank 500 and of the sixth rank 600 is blocked.

If at least one of the chip select signals CS6 and CS7 coupled to the respective first input 41 and the second input 42 of the fourth register 40 is active, then the command/address signals CA are transmitted via the at least one third output 46 to the memory chips 3 of the seventh rank 700 and of the eighth rank 800. If both chip select signals CS6 and CS7 are inactive, then the transmission of command/address signals CA via the at least one third output 46 to the memory chips 3 of the seventh rank 700 and of the eighth rank 800 is blocked.

Figure 5:
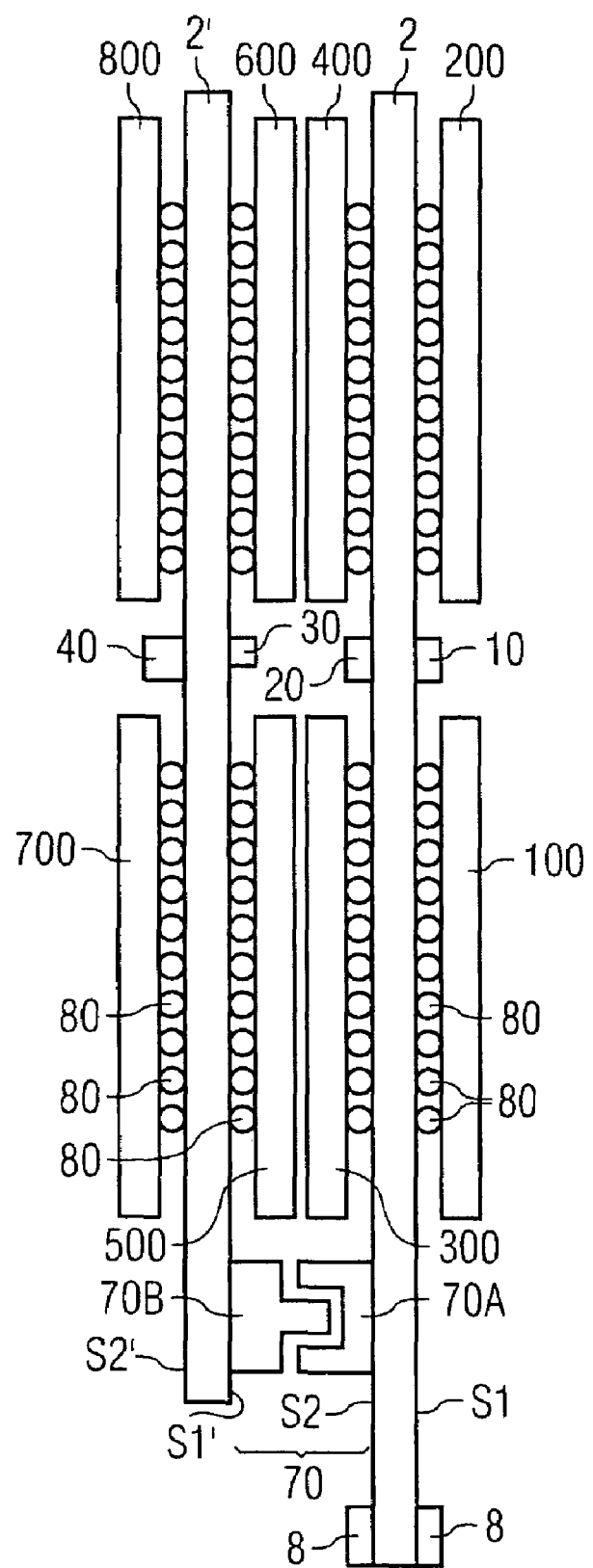
FIG. 5 depicts schematically a cross-sectional view of the semiconductor memory module of the electronic apparatus depicted in FIG. 4.

FIG. 5 depicts schematically a cross-sectional view of the semiconductor memory module 1 of the electronic apparatus of FIG. 4. The semiconductor memory module 1 includes a first circuit substrate 2 and a second circuit substrate 2', each having a first surface S1, S1' and a second surface S2, S2'.

A first register 10 is disposed on the first surface S1 of the first circuit substrate 2, a second register 20 is disposed on the second surface S2 of the first circuit substrate 2, a third register 30 is disposed on the first surface S1' of the second circuit substrate 2' and a fourth register 40 is disposed on the second surface S2' of the second circuit substrate 2'.

A respective first rank 100, 500 and a respective second rank 200, 600 of memory chips (not shown in FIG. 5) are disposed on the respective first surface S1, S1' of the respective circuit substrate 2, 2'.

A respective third rank 300, 700 and a respective fourth rank 400, 800 of memory chips (not shown in FIG. 5) are disposed on the respective second surface S2, S2' of the respective circuit substrate 2, 2'.

Typically, memory chips (not shown in FIG. 5) are coupled to respective circuit substrates by solder balls 80 to provide an electrical connection between the memory chips and the circuit substrates.

A connector 70 provides a connection between the first circuit substrate 2 and the second circuit substrate 2' for the transmission of electrical signals. The connector 70 includes a plug 70B disposed on the first surface S1' of the second circuit substrate 2' and a socket 70A disposed on the second surface S2 of the first circuit substrate 2.

An edge connector 8 disposed on one end of the first circuit substrate 2 provides electrical connection between the electronic apparatus and a bus system (not shown in FIG. 5) for the transmission of electrical signals between an external device such as the controller device depicted in FIG. 4 and the electronic apparatus via a bus system.

What is claimed is:

1. A semiconductor memory module comprising:
   a circuit substrate;
   a first, a second, a third and a fourth rank of memory chips each rank including a plurality of memory chips and each being disposed on said circuit substrate;
   a first register and a second register each disposed on said circuit substrate, said first register and said second register each comprising:
   a first input for receiving a chip select signal having one of an active or an inactive level;
   a second input for receiving a other chip select signal having one of an active or an inactive level;
   at least one third input for receiving command/address signals;
   a first output coupled to transmit said chip select signal to said memory chips of said first rank and said third rank;
   a second output coupled to transmit said other chip select signal to said memory chips of said second rank and said fourth rank;
   at least one third output, wherein said at least one third output of said first register is coupled to transmit said command/address signals to said memory chips of said first rank and to said memory chips of said second rank, if at least one of said chip select signal received at said first input of said first register and said other chip select signal received at said second input of said first register is active, and to block a transmission of said command/address signals to said memory chips of said first rank and to said memory chips of said second rank, if both said chip select signal received at said first input of said first register and said other chip select signal received at said second input of said first register are inactive; and
   said at least one third output of said second register is coupled to transmit said command/address signals to said memory chips of said third rank and to said memory chips of said fourth rank, if at least one of said chip select signal received at said first input of said second register and said other chip select signal received at said second input of said second register is active, and to block a transmission of said command/address signals to said memory chips of said third rank and to said memory chips of said fourth rank, if both said chip select signal received at said first input of said second register and said other chip select signal received at said second input of said second register are inactive.

2. The semiconductor memory module according to claim 1, wherein said circuit substrate has a first surface and a second surface, wherein said first register and said memory chips of said first rank are disposed on said first surface and said memory chips of said second rank are stacked upon said memory chips of said first rank, and wherein
   said second register and said memory chips of said third rank are disposed on said second surface and said memory chips of said fourth rank are stacked upon said memory chips of said third rank.

3. The semiconductor memory module according to claim 1, wherein said circuit substrate comprises an edge connector having contacts for transmitting electrical signals between said circuit substrate and an external device.

4. The semiconductor memory module according to claim 3, wherein ends of said contacts are coupled via respective conductive lines disposed on said circuit substrate to said first input, to said second input and to said at least one third input of each of said first register and said second register.

5. The semiconductor memory module according to claim 4, wherein said electrical signals comprise said chip select signals, said other chip select signals and said command/address signals.

6. The semiconductor memory module according to claim 1, wherein each of said first register and said second register comprises a fourth input for receiving a control signal having one of an active and an inactive level;
   said at least one third output of said first register coupled to transmit said command/address signals, if said control signal is active and if at least one of said chip select signal received at said first input of said first register and said other chip select signal received at said second input of said first register is active, and to block said command/address signals, if said control signal is active and if both said chip select signal received at said first input of said first register and said other chip select signal received at said second input of said first register are inactive;
   said at least one third output of said first register coupled to transmit said command/address signals, if said control signal is inactive;
   said at least one third output of said second register coupled to transmit said command/address signals, if said control signal is active and if at least one of said chip select signal received at said first input of said second register and said other chip select signal received at said second input of said second register is active, and to block said command/address signals, if said control signal is active and if both said chip select signal received at said first input of said second register and said other chip select signal received at said second input of said second register are inactive; and
   said at least one third output of said second register coupled to transmit said command/address signals if said control signal is inactive.

7. The semiconductor memory module according to claim 1, wherein said semiconductor module has a socket disposed on said circuit substrate, said semiconductor memory module further comprising:
   another circuit substrate having a plug disposed thereon;
   a fifth, a sixth, a seventh, and an eighth rank of memory chips each including a plurality of memory chips and each being disposed on said other circuit substrate;
   a third register and a fourth register each disposed on said other circuit substrate, said third register and said fourth register each comprising:
   a first input for receiving a third chip select signal having one of an active or an inactive level;
   a second input for receiving a fourth chip select signal having one of an active or an inactive level;
   at least one third input for receiving command/address signals;
   a first output for coupled to transmit said third chip select signal to said memory chips of said fifth rank and said seventh rank;
   a second output for coupled to transmit said fourth chip select signal to said memory chips of said sixth rank and said eighth rank; and
   at least one third output, wherein said socket of said circuit board and said plug of said other circuit board are coupled and provide an electrical connection for the transmission of said chip select signal, said other chip select signal, said third chip select signal, said fourth chip select signal and said command/address signal between said circuit board and said other circuit board;

said at least one third output of said third register is coupled to transmit said command/address signals, if at least one of said third chip select signal received at said first input of said third register and said fourth chip select signal received at said second input of said third register is active, and to block said command/address signals, if both said third chip select signal received at said first input of said third register and said fourth chip select signal received at said second input of said third register are inactive; and said at least one third output of said fourth register is coupled to transmit said command/address signals, if at least one of said third chip select signal received at said first input of said fourth register and said fourth chip select signal received at said second input of said fourth register is active, and to block said command/address signals, if both said third chip select signal received at said first input of said fourth register and said fourth chip select signal received at said second input of said fourth register are inactive.

8. The semiconductor memory module according to claim 7, wherein said other circuit substrate has a first surface and a second surface, wherein said third register, said memory chips of said fifth rank and said memory chips of said sixth rank are disposed on said first surface, and wherein said fourth register, said memory chips of said seventh rank and said memory chips of said eighth rank are disposed on said second surface.

9. The semiconductor memory module according to claim 7, wherein each of said third register and said fourth register comprises a fourth input for receiving a control signal having one of an active and an inactive level;

said at least one third output of said third register coupled to transmit said command/address signals, if said control signal is active and if at least one of said third chip select signal received at said first input of said third register and said fourth chip select signal received at said second input of said third register is active, and to block said command/address signals, if said control signal is active and if both said third chip select signal received at said first input of said third register and said fourth chip select signal received at said second input of said third register are inactive;

said at least one third output of said third register coupled to transmit said command/address signals, if said control signal is inactive;

said at least one third output of said fourth register coupled to transmit said command/address signals, if said control signal is active and if at least one of said third chip select signal received at said first input of said fourth register and said fourth chip select signal received at said second input of said fourth register is active, and to block said command/address signals, if said control signal is active and if both said third chip select signal received at said first input of said fourth register and said fourth chip select signal received at said second input of said fourth register are inactive; and said at least one third output of said fourth register coupled to transmit said command/address signals if said control signal is inactive.

10. The semiconductor memory module according to claim 1, wherein said memory chips comprise dynamic random access memory chips.

11. The semiconductor memory module according to claim 1, wherein said memory chips comprise synchronous dynamic random access memory chips.

12. The semiconductor memory module according to claim 1, wherein said semiconductor memory module comprises a dual inline memory module.

13. An electronic apparatus comprising:

a controller device;

a bus system;

at least one semiconductor memory module comprising:

a circuit substrate;

a first, a second, a third and a fourth rank of memory chips each rank including a plurality of memory chips and each being disposed on said circuit substrate;

a first register and a second register each disposed on said circuit substrate, said first register and said second register each comprising:

a first input coupled to said controller device for receiving a chip select signal having one of an active or an inactive level;

a second input coupled to said controller device for receiving a other chip select signal having one of an active or an inactive level;

at least one third input coupled to said controller device via said bus system for receiving command/address signals;

a first output coupled to transmit said chip select signal to said memory chips of said first rank and said third rank;

a second output coupled to transmit said other chip select signal to said memory chips of said second rank and said fourth rank;

at least one third output, wherein said at least one third output of said first register is coupled to transmit said command/address signals to said memory chips of said first rank and to said memory chips of said second rank, if at least one of said chip select signal received at said first input of said first register and said other chip select signal received at said second input of said first register is active, and to block a transmission of said command/address signals to said memory chips of said first rank and to said memory chips of said second rank, if both said chip select signal received at said first input of said first register and said other chip select signal received at said second input of said first register are inactive; and said at least one third output of said second register is coupled to transmit said command/address signals to said memory chips of said third rank and to said memory chips of said fourth rank, if at least one of said chip select signal received at said first input of said second register and said other chip select signal received at said second input of said second register is active, and to block a transmission of said command/address signals to said memory chips of said third rank and to said memory chips of said fourth rank, if both said chip select signal received at said first input of said second register and said other chip select signal received at said second input of said second register are inactive.

14. The electronic apparatus according to claim 13, wherein said circuit substrate has a first surface and a second surface, wherein said first register and said memory chips of said first rank are disposed on said first surface and said memory chips of said second rank are stacked upon said memory chips of said first rank, and wherein said second register and said memory chips of said third rank are disposed on said second surface and said memory chips of said fourth rank are stacked upon said memory chips of said third rank.

15. The electronic apparatus according to claim 13, wherein said circuit substrate comprises an edge connector having contacts for transmitting electrical signals between said circuit substrate and an external device.

16. The electronic apparatus according to claim 15, wherein ends of said contacts are coupled via respective conductive lines disposed on said circuit substrate to said first input, to said second input and to said at least one third input of each of said first register and said second register.

17. The electronic apparatus according to claim 16, wherein said electrical signals comprise said chip select signals, said other chip select signals and said command/address signals.

18. The electronic apparatus according to claim 13, wherein each of said first register and said second register comprises a fourth input for receiving a control signal having one of an active and an inactive level;

said at least one third output of said first register coupled to transmit said command/address signals, if said control signal is active and if at least one of said chip select signal received at said first input of said first register and said other chip select signal received at said second input of said first register is active, and to block said command/address signals, if said control signal is active and if both said chip select signal received at said first input of said first register and said other chip select signal received at said second input of said first register are inactive;

said at least one third output of said first register coupled to transmit said command/address signals, if said control signal is inactive;

said at least one third output of said second register coupled to transmit said command/address signals, if said control signal is active and if at least one of said chip select signal received at said first input of said second register and said other chip select signal received at said second input of said second register is active, and to block said command/address signals, if said control signal is active and if both said chip select signal received at said first input of said second register and said other chip select signal received at said second input of said second register are inactive; and said at least one third output of said second register coupled to transmit said command/address signals if said control signal is inactive.

19. The electronic apparatus according to claim 13, wherein said semiconductor module has a socket disposed on said circuit substrate, said semiconductor memory module further comprising:

another circuit substrate having a plug disposed thereon;

a fifth, a sixth, a seventh, and an eighth rank of memory chips each including a plurality of memory chips and each being disposed on said other circuit substrate;

a third register and a fourth register each disposed on said other circuit substrate, said third register and said fourth register each comprising:

a first input coupled to said controller device for receiving a third chip select signal having one of an active or an inactive level;

a second input coupled to said controller device for receiving a fourth chip select signal having one of an active or an inactive level;

at least one third input coupled to said controller device via said bus system for receiving command/address signals;

a first output for coupled to transmit said third chip select signal to said memory chips of said fifth rank and said seventh rank;

a second output for coupled to transmit said fourth chip select signal to said memory chips of said sixth rank and said eighth rank; and at least one third output, wherein said socket of said circuit board and said plug of said other circuit board are coupled and provide an electrical connection for the transmission of said chip select signal, said other chip select signal, said third chip select signal, said fourth chip select signal and said command/address signal between said circuit board and said other circuit board;

said at least one third output of said third register is coupled to transmit said command/address signals, if at least one of said third chip select signal received at said first input of said third register and said fourth chip select signal received at said second input of said third register is active, and to block said command/address signals, if both said third chip select signal received at said first input of said third register and said fourth chip select signal received at said second input of said third register are inactive; and said at least one third output of said fourth register is coupled to transmit said command/address signals, if at least one of said third chip select signal received at said first input of said fourth register and said fourth chip select signal received at said second input of said fourth register is active, and to block said command/address signals, if both said third chip select signal received at said first input of said fourth register and said fourth chip select signal received at said second input of said fourth register are inactive.

20. The electronic apparatus according to claim 19, wherein said other circuit substrate has a first surface and a second surface, wherein said third register, said memory chips of said fifth rank and said memory chips of said sixth rank are disposed on said first surface, and wherein said fourth register, said memory chips of said seventh rank and said memory chips of said eighth rank are disposed on said second surface.

21. The electronic apparatus according to claim 19, wherein each of said third register and said fourth register comprises a fourth input for receiving a control signal having one of an active and an inactive level;

said at least one third output of said third register coupled to transmit said command/address signals, if said control signal is active and if at least one of said third chip select signal received at said first input of said third register and said fourth chip select signal received at said second input of said third register is active, and to block said command/address signals, if said control signal is active and if both said third chip select signal received at said first input of said third register and said fourth chip select signal received at said second input of said third register are inactive;

said at least one third output of said third register coupled to transmit said command/address signals, if said control signal is inactive;

said at least one third output of said fourth register coupled to transmit said command/address signals, if said control signal is active and if at least one of said third chip select signal received at said first input of said fourth register and said fourth chip select signal received at said second input of said fourth register is active, and to block said command/address signals, if said control signal is active and if both said third chip select signal received at said first input of said fourth register and said fourth chip select signal received at said second input of said fourth register are inactive; and said at least one third output of said fourth register coupled to transmit said command/address signals if said control signal is inactive.

22. The electronic apparatus according to claim 13, wherein said memory chips comprise dynamic random access memory chips.

23. The electronic apparatus according to claim 13, wherein said memory chips comprise synchronous dynamic random access memory chips.

24. The electronic apparatus according to claim 13, wherein said semiconductor memory module comprises a dual inline memory module.

25. A method of operating a semiconductor memory module, said method comprising:
  providing a semiconductor memory module comprising:
    a circuit substrate;
    a first, a second, a third and a fourth rank of memory chips each rank including a plurality of memory chips and each being disposed on said circuit substrate;
    a first register and a second register each disposed on said circuit substrate, said first register and said second register each comprising:
      a first input for receiving a chip select signal having one of an active or an inactive level;
      a second input for receiving a other chip select signal having one of an active or an inactive level;
      at least one third input for receiving command/address signals;
      a first output coupled to transmit said chip select signal to said memory chips of said first rank and said third rank;
      a second output coupled to transmit said other chip select signal to said memory chips of said second rank and said fourth rank;
      at least one third output;
  determining if one of said chip select signals and one of said other chip select signals is active;
  transmitting said command/address signals to said memory chips of said first rank and to said memory chips of said second rank via said at least one third output of said first register if at least one of said chip select signal received at said first input of said first register and said other chip select signal received at said second input of said first register is active, and to block a transmission of said command/address signals to said memory chips of said first rank and to said memory chips of said second rank, if both said chip select signal received at said first input of said first register and said other chip select signal received at said second input of said first register are inactive; and transmitting said command/address signals via said at least one third output of said second register to said memory chips of said third rank and to said memory chips of said fourth rank, if at least one of said chip select signal received at said first input of said second register and said other chip select signal received at said second input of said second register is active, and to block a transmission of said command/address signals to said memory chips of said third rank and to said memory chips of said fourth rank, if both said chip select signal received at said first input of said second register and said other chip select signal received at said second input of said second register are inactive.

26. The method according to claim 25, wherein said circuit substrate has a first surface and a second surface, wherein said first register and said memory chips of said first rank are disposed on said first surface and said memory chips of said second rank are stacked upon said memory chips of said first rank, and wherein said second register and said memory chips of said third rank are disposed on said second surface and said memory chips of said fourth rank are stacked upon said memory chips of said third rank.

27. The method according to claim 25, wherein said circuit substrate comprises an edge connector having contacts for transmitting electrical signals between said circuit substrate and an external device.

28. The method according to claim 27, wherein ends of said contacts are coupled via respective conductive lines disposed on said circuit substrate to said first input, to said second input and to said at least one third input of each of said first register and said second register.

29. The method according to claim 28, wherein said electrical signals comprise said chip select signals, said other chip select signals and said command/address signals.

30. The method according to claim 25, wherein each of said first register and said second register comprises a fourth input for receiving a control signal having one of an active and an inactive level;

said at least one third output of said first register coupled to transmit said command/address signals, if said control signal is active and if at least one of said chip select signal received at said first input of said first register and said other chip select signal received at said second input of said first register is active, and to block said command/address signals, if said control signal is active and if both said chip select signal received at said first input of said first register and said other chip select signal received at said second input of said first register are inactive;

said at least one third output of said first register coupled to transmit said command/address signals, if said control signal is inactive;

said at least one third output of said second register coupled to transmit said command/address signals, if said control signal is active and if at least one of said chip select signal received at said first input of said second register and said other chip select signal received at said second input of said second register is active, and to block said command/address signals, if said control signal is active and if both said chip select signal received at said first input of said second register and said other chip select signal received at said second input of said second register are inactive; and said at least one third output of said second register coupled to transmit said command/address signals if said control signal is inactive.

31. The method according to claim 25, wherein said semiconductor module has a socket disposed on said circuit substrate, said semiconductor memory module further comprising:
- another circuit substrate having a plug disposed thereon;
- a fifth, a sixth, a seventh, and an eighth rank of memory chips each including a plurality of memory chips and each being disposed on said other circuit substrate;
- a third register and a fourth register each disposed on said other circuit substrate, said third register and said fourth register each comprising:
  - a first input for receiving a third chip select signal having one of an active or an inactive level;
  - a second input for receiving a fourth chip select signal having one of an active or an inactive level;
  - at least one third input for receiving command/address signals;
  - a first output for coupled to transmit said third chip select signal to said memory chips of said fifth rank and said seventh rank;
  - a second output for coupled to transmit said fourth chip select signal to said memory chips of said sixth rank and said eighth rank; and
  - at least one third output, wherein said socket of said circuit board and said plug of said other circuit board are coupled and provide an electrical connection for the transmission of said chip select signal, said other chip select signal, said third chip select signal, said fourth chip select signal and said command/address signal between said circuit board and said other circuit board;
- said at least one third output of said third register is coupled to transmit said command/address signals, if at least one of said third chip select signal received at said first input of said third register and said fourth chip select signal received at said second input of said third register is active, and to block said command/address signals, if both said third chip select signal received at said first input of said third register and said fourth chip select signal received at said second input of said third register are inactive; and
- said at least one third output of said fourth register is coupled to transmit said command/address signals, if at least one of said third chip select signal received at said first input of said fourth register and said fourth chip select signal received at said second input of said fourth register is active, and to block said command/address signals, if both said third chip select signal received at said first input of said fourth register and said fourth chip select signal received at said second input of said fourth register are inactive.

32. The method according to claim 31, wherein said other circuit substrate has a first surface and a second surface, wherein said third register, said memory chips of said fifth rank and said memory chips of said sixth rank are disposed on said first surface, and wherein
- said fourth register, said memory chips of said seventh rank and said memory chips of said eighth rank are disposed on said second surface.

33. The method according to claim 31, wherein each of said third register and said fourth register comprises a fourth input for receiving a control signal having one of an active and an inactive level;
- said at least one third output of said third register coupled to transmit said command/address signals, if said control signal is active and if at least one of said third chip select signal received at said first input of said third register and said fourth chip select signal received at said second input of said third register is active, and to block said command/address signals, if said control signal is active and if both said third chip select signal received at said first input of said third register and said fourth chip select signal received at said second input of said third register are inactive;
- said at least one third output of said third register coupled to transmit said command/address signals, if said control signal is inactive;
- said at least one third output of said fourth register coupled to transmit said command/address signals, if said control signal is active and if at least one of said third chip select signal received at said first input of said fourth register and said fourth chip select signal received at said second input of said fourth register is active, and to block said command/address signals, if said control signal is active and if both said third chip select signal received at said first input of said fourth register and said fourth chip select signal received at said second input of said fourth register are inactive; and
- said at least one third output of said fourth register coupled to transmit said command/address signals if said control signal is inactive.

34. The method according to claim 25, wherein said memory chips comprise dynamic random access memory chips.

35. The method according to claim 25, wherein said memory chips comprise synchronous dynamic random access memory chips.

36. The method according to claim 25, wherein said semiconductor memory module comprises a dual inline memory module.

* * * * *

UNITED STATES PATENT AND TRADEMARK OFFICE
CERTIFICATE OF CORRECTION

PATENT NO. : 7,359,257 B2
APPLICATION NO. : 11/364135
DATED : April 15, 2008
INVENTOR(S) : RaghuRam It is certified that error appears in the above-identified patent and that said Letters Patent is hereby corrected as shown below:

In Col. 14, line 59, after output, delete "for".
In Col. 14, line 62, after output, delete "for".
In Col. 18, line 10, after output, delete "for".
In Col. 18, line 13, after output, delete "for".
In Col. 21, line 21, after output, delete "for".
In Col. 21, line 24, after output, delete "for".

Signed and Sealed this

Eighth Day of July, 2008

JON W. DUDAS
*Director of the United States Patent and Trademark Office*